(12) United States Patent
Lagana-Gizzo et al.

(10) Patent No.: US 9,123,505 B1
(45) Date of Patent: Sep. 1, 2015

(54) APPARATUS AND METHODS FOR IMPLEMENTING PREDICTED SYSTEMATIC ERROR CORRECTION IN LOCATION SPECIFIC PROCESSING

(71) Applicant: TEL Epion Inc., Billerica, MA (US)

(72) Inventors: Vincent Lagana-Gizzo, East Greenbush, NY (US); Noel Russell, Waterford, NY (US); Joshua LaRose, Albany, NY (US); Soo Doo Chae, Guilderland, NY (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 14/492,819

(22) Filed: Sep. 22, 2014

Related U.S. Application Data

(60) Provisional application No. 61/942,835, filed on Feb. 21, 2014.

(51) Int. Cl.
*H01J 37/304* (2006.01)
*H01J 37/317* (2006.01)
*H01J 37/30* (2006.01)

(52) U.S. Cl.
CPC .......... *H01J 37/304* (2013.01); *H01J 37/3005* (2013.01); *H01J 2237/08* (2013.01); *H01J 2237/30455* (2013.01); *H01J 2237/317* (2013.01)

(58) Field of Classification Search
CPC ... H01J 37/30; H01J 37/3002; H01J 37/3005; H01J 37/304; H01J 37/3045; H01J 37/3171; H01J 37/3172; H01J 37/3178
USPC ................................ 250/492.2–492.22, 492.3
See application file for complete search history.

(56) References Cited

U.S. PATENT DOCUMENTS

| 7,060,989 | B2 | 6/2006 | Swenson et al. |
| 7,173,252 | B2 | 2/2007 | Mack |
| 7,550,748 | B2 * | 6/2009 | Caliendo et al. ......... 250/492.21 |
| 7,550,749 | B2 | 6/2009 | Caliendo et al. |
| 7,626,183 | B2 | 12/2009 | Wagner et al. |

(Continued)

FOREIGN PATENT DOCUMENTS

| JP | 2004503064 A | 1/2004 |
| WO | 2009145798 A2 | 12/2009 |

OTHER PUBLICATIONS

International Searching Authority/KR, International Search Report and Written Opinion issued in corresponding Application No. PCT;US2015/010655, dated Apr. 29, 2015, 10 pp.

*Primary Examiner* — Nicole Ippolito
*Assistant Examiner* — David E Smith
(74) *Attorney, Agent, or Firm* — Wood, Herron & Evans, LLP

(57) ABSTRACT

A method of modifying an upper layer of a workpiece using a gas cluster ion beam (GCIB) is described. The method includes collecting parametric data relating to an upper layer of a workpiece, and determining a predicted systematic error response for applying a GCIB to the upper layer to alter an initial profile of a measured attribute by using the parametric data. Additionally, the method includes identifying a target profile of the measured attribute, directing the GCIB toward the upper layer of the workpiece, and spatially modulating an applied property of the GCIB, based at least in part on the predicted systematic error response and the parametric data, as a function of position on the upper layer of the workpiece to achieve the target profile of the measured attribute.

20 Claims, 10 Drawing Sheets

(56) References Cited

U.S. PATENT DOCUMENTS

2008/0237492 A1* 10/2008 Caliendo et al. ........... 250/492.3
2009/0084759 A1*  4/2009 MacCrimmon et al. ........ 216/84
2010/0193472 A1   8/2010 Tabat et al.
2010/0193701 A1   8/2010 Tabat et al.
2013/0075366 A1*  3/2013 Hautala .......................... 216/66

* cited by examiner

APPARATUS AND METHODS FOR IMPLEMENTING PREDICTED SYSTEMATIC ERROR CORRECTION IN LOCATION SPECIFIC PROCESSING

CROSS-REFERENCE TO RELATED APPLICATIONS

Pursuant to 37 C.F.R. §1.78(a)(4), this application claims the benefit of and priority to U.S. Provisional Application No. 61/942,835, filed on Feb. 21, 2014, which is expressly incorporated by reference herein in its entirety.

BACKGROUND OF THE INVENTION

1. Field of Invention

The field of invention relates generally to the fields of material processing and semiconductor integrated circuit manufacturing and, more specifically but not exclusively, relates to correction of systematic errors or non-uniformities through location specific processing using gas cluster ion beam (GCIB) technology.

2. Description of Related Art

Gas cluster ion beam (GCIB) technology has been demonstrated as a useful processing technique for modifying, etching, cleaning, smoothing, and forming thin films on workpieces, including microelectronic workpieces. For purposes of this discussion, gas clusters are nano-sized aggregates of material that are gaseous under conditions of standard temperature and pressure. Such gas clusters may be formed by the condensation of individual gas atoms (or molecules) during the adiabatic expansion of high-pressure gas from a nozzle into a vacuum, and they may consist of aggregates including a few to several thousand atoms/molecules, or more, that are loosely bound together by weak interatomic forces referred to as Van der Waals forces. The gas clusters can be ionized by electron bombardment, which permits the gas clusters to be accelerated using an electric field to form directed beams of controllable beam energy.

Irradiation of a workpiece by a directed GCIB of controllable energy may be used to treat the workpiece according to a dose that is specific to the location on the workpiece. The technique is oftentimes referred to as location specific processing (LSP), wherein the treatment dose or dwell time of the GCIB is varied across the workpiece by adjusting the scan speed. Therefore, one location on the workpiece may be processed differently than another location.

Several emerging applications for GCIB processing of workpieces on an industrial scale exist for semiconductor/microelectronic device fabrication. At present, with continued dimensional scaling in advanced CMOS (complementary metal oxide semiconductor) logic, the requirements for dimensional variability control are concurrently increasing. For multiple technology nodes, advanced control using variable lithographic exposure across wafer has been used to help control critical dimensions in the plane of the wafer. Until the 22 nm (nanometer) node, the most critical dimensions in the vertical dimension have been well controlled by a single deposition or oxidation step. However, with the implementation of replacement metal gate (RMG) techniques and FIN-FET (fin field effect transistor) structures, some critical dimensions, such as fin height and gate height, are affected by a combination of deposition, CMP (chemical mechanical planarization), and etch steps, requiring a new strategy for precision feature height control. Gas cluster ion beam (GCIB) technology offers precise correction of feature height non-uniformity using LSP algorithms.

Yet, in addition to correcting the non-uniformity present on the workpiece, the implementation of GCIB processing must also correct errors caused by system and/or equipment specific process anomalies that repeatedly affect the output process parameters of a GCIB apparatus. To improve LSP corrective capability, the systematic error for the GCIB processing system must be determined using sacrificial workpieces, which is costly and time intensive.

SUMMARY OF THE INVENTION

Embodiments of the invention relate generally to the fields of material processing and semiconductor integrated circuit manufacturing and, more specifically but not exclusively, relate to correction of systematic errors or non-uniformities through location specific processing using gas cluster ion beam (GCIB) technology. In particular, a predictive method is used to accommodate for systematic error when performing GCIB location specific processing.

According to one embodiment, a method of modifying an upper layer of a workpiece using a gas cluster ion beam (GCIB) is described. The method includes collecting parametric data relating to an upper layer of a workpiece, and determining a predicted systematic error response for applying a GCIB to the upper layer to alter an initial profile of a measured attribute by using the parametric data. Additionally, the method includes identifying a target profile of the measured attribute, directing the GCIB toward the upper layer of the workpiece, and spatially modulating an applied property of the GCIB, based at least in part on the predicted systematic error response and the parametric data, as a function of position on the upper layer of the workpiece to achieve the target profile of the measured attribute.

DETAILED DESCRIPTION OF SEVERAL EMBODIMENTS

Methods and systems for performing location specific processing (LSP) of a workpiece using gas cluster ion beam (GCIB) technology are described in various embodiments. One skilled in the relevant art will recognize that the various embodiments may be practiced without one or more of the specific details, or with other replacement and/or additional methods, materials, or components. In other instances, wellknown structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Workpiece" as used herein generically refers to the object being processed in accordance with the invention. The workpiece may include any material portion or structure of a device, particularly a semiconductor or other electronics device, and may, for example, be a base workpiece structure, such as a semiconductor wafer or a layer on or overlying a base workpiece structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of workpieces, but this is for illustrative purposes only and not limitation.

As described in part above, when correcting the non-uniformity present on a workpiece, the implementation of GCIB processing must also correct errors caused by system and/or equipment specific process anomalies that repeatedly affect the output process parameters of a GCIB apparatus. To improve LSP corrective capability, a predictive method is used to accommodate for systematic error during GCIB location specific processing according to various embodiments.

Figure 1:
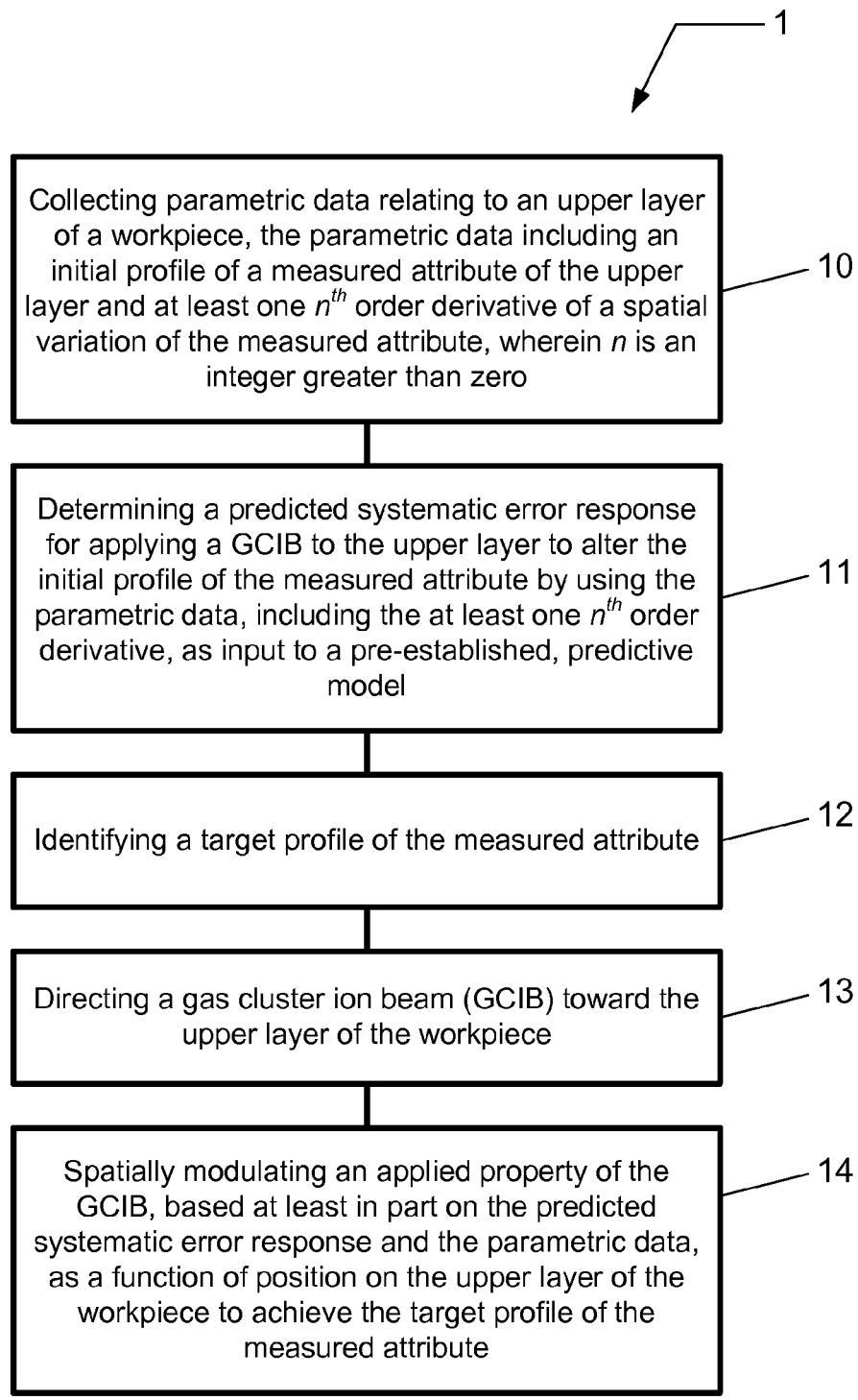
FIG. 1 is a flow chart illustrating a method for processing a workpiece according to an embodiment.

Therefore, according to various embodiments, methods for location specific processing (LSP) of a workpiece using a gas cluster ion beam (GCIB) with enhanced corrective capability are described. Referring now to the drawings wherein like reference numerals designate corresponding parts throughout the several views, FIG. 1 provides a flow chart 1 illustrating a method for modifying an upper layer of a workpiece using GCIB processing according to an embodiment.

The method illustrated in flow chart 1 begins in 10 with collecting parametric data relating to an upper layer of a workpiece. The parametric data includes an initial profile of a measured attribute of the upper layer and at least one $n^{th}$ order derivative of a spatial variation of the measured attribute, wherein n is an integer greater than zero. The parametric data may include geometrical, mechanical, electrical, and/or optical parameters associated with the workpiece, any layer or sub-layer formed on the workpiece, and/or any portion of a device on the workpiece. For example, metrology data can include any parameter measurable by the metrology systems described below. Additionally, for example, the measured attribute may include a film thickness, a surface and/or interfacial roughness, a surface contamination, a feature depth, a trench depth, a via depth, a feature width, a trench width, a via width, a critical dimension (CD), a surface roughness, or an electrical resistance, or any combination of two or more thereof.

Figure 2:
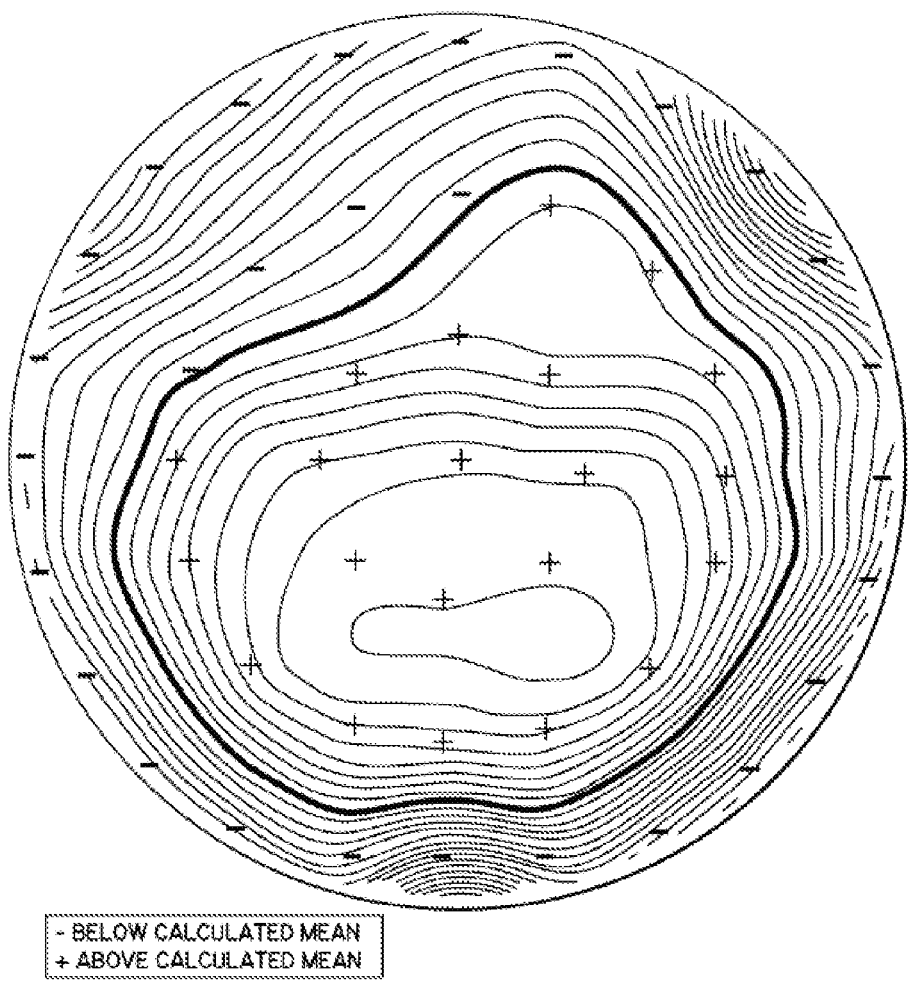
FIG. 2 shows an exemplary profile of a measured attribute according to an embodiment.

As an example, FIG. 2 shows an exemplary profile spatial map of a measured attribute, wherein the calculated mean has been subtracted from the spatial map to produce thicker film regions (indicated with the "+" sign) and thinner film regions (indicated with the "−" sign). The measured attribute is measured at different locations on the workpiece, and a spatial map of film thickness for the upper layer on the workpiece is created. In this example shown in FIG. 2, the spatial map of film thickness was measured by spectroscopic ellipsometry using a commercially available, model UV-1280SE thin film measurement instrument manufactured by KLA-Tencor Corporation.

The parametric data, including the measured attribute, may be acquired using a metrology system coupled to a GCIB processing system, either in-situ or ex-situ. The metrology system may comprise any variety of workpiece diagnostic system including, but not limited to, geometrical, mechanical, optical, and/or electrical test/metrology systems. For example, the metrology system may include optical digital profilometry (ODP), scatterometry, ellipsometry, reflectometry, interferometry, X-ray fluorescence spectroscopy, scanning electron microscopy (SEM), tunneling electron microscopy (TEM), atomic force microscopy (AFM), or four-point probe sensing, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a workpiece.

The parametric data may be measured at two or more locations on the workpiece. Moreover, this data may be acquired and collected for one or more workpieces. The one or more workpieces may, for instance, include a cassette of workpieces. The parametric data is measured at two or more locations on at least one of the one or more workpieces and may, for example, be acquired at a plurality of locations on each of the one or more workpieces. Thereafter, the plurality of locations on each of the plurality of workpieces can be expanded from measured sites to unmeasured sites using a data fitting algorithm. For example, the data fitting algorithm can include interpolation (linear or nonlinear) or extrapolation (linear or nonlinear) or a combination thereof.

Once parametric data is collected for the one or more workpieces using the metrology system, the parametric data is provided to a controller for computing correction data. Parametric data may be communicated between the metrology system and the controller via a physical connection (e.g., a cable), or a wireless connection, or a combination thereof. Additionally, the parametric data may be communicated via an intranet or Internet connection. Alternatively, parametric data may be communicated between the metrology system and the controller via a computer readable medium.

The at least one $n^{th}$ order derivative of a spatial variation of the measured attribute may include a first derivative of a spatial variation of the measured attribute on the workpiece. The first derivative, or spatial gradient, represents the rate of change or spatial variation of the measured attribute across the workpiece. For example, the first derivative indicates whether the measured attribute smoothly varies or more sharply varies across the workpiece at a given location on the workpiece.

Additionally, the at least one $n^{th}$ order derivative of a spatial variation of the measured attribute may include a second derivative of a spatial variation of the measured attribute on the workpiece. The second derivative, or spatial curvature, represents the rate of change or spatial variation in the gradient of the measured attribute across the workpiece. For example, the second derivative indicates the degree of concavity or convexity of the measured attribute at a given location on the workpiece.

The at least one $n^{th}$ order derivative of a spatial variation of the measured attribute may be measured and/or computed at multiple locations on the workpiece, which may or may not correspond to locations where the measured attribute are measured. As an example, the at least one $n^{th}$ order derivative of a spatial variation of the measured attribute is computed at each location the measured attribute of the upper layer is acquired using an interpolation algorithm, or a data fitting algorithm, or a combination thereof. For example, the at least one $n^{th}$ order derivative of a spatial variation of the measured attribute may be determined using a finite difference scheme.

In 11, a predicted systematic error response for applying a GCIB to the upper layer to alter the initial profile of the measured attribute is determined by using the parametric data, including the at least one $n^{th}$ order derivative, as input to a pre-established, predictive model. The pre-established, predictive model is established by performing the following: (i) measuring representative parametric data including an initial representative profile of a representative attribute of an upper layer on one or more representative workpieces and at least one $n^{th}$ order derivative of a spatial variation of the representative attribute, wherein n is an integer greater than zero; (ii) establishing a representative target profile; (iii) computing representative correction data using the initial representative profile and the target representative profile for the representative attribute; (iv) applying the representative correction data to the workpiece by spatially modulating an applied dose of a representative GCIB; (v) comparing an actual representative profile with the target representative profile to determine a representative systematic error; and (vi) correlating the representative systematic error with the representative parametric data.

The correlating of the representative systematic error with the representative parametric data may include applying a least-squares technique to the representative parametric data and the representative systematic error, and formulating a functional relationship between the representative parametric data and the representative systematic error that minimizes a sum of the squared residuals produced by the functional relationship. The error approximation may include a second order model that correlates measured attribute data, first derivative data, and second derivative data with the error, viz.

$$\hat{E}=A+B*Z+C*dZ/dx+D*d^2Z/dx^2+E*dZ/dy+F*d^2Z/dy^2+G*Z^2+H*(dZ/dx)^2+I*(dZ/dx)^2+J*Z*dZ/dx+K*Z*dZ/dy+L*dZ/dx*dZ/dy, \quad (1)$$

wherein Z represents the measured attribute data, dZ/dx and dZ/dy represent the first derivative (gradient) of the measured attribute in the x and y directions (e.g., orthogonal directions in the plane of the workpiece), $d^2Z/dx^2$ and $d^2Z/dy^2$ represent the second derivative (curvature) of the measured attribute in the x and y directions, and A, B, C, D, E, F, G, H, I, J, K, and L are the coefficients determined for the error model using the least-squares technique. Alternatively, a simplified error approximation may include a first order model that correlates measured attribute data and first derivative data with the error, viz.

$$\hat{E}=A+B*Z+C*dZ/dx+E*dZ/dy. \quad (2)$$

Figure 3A:
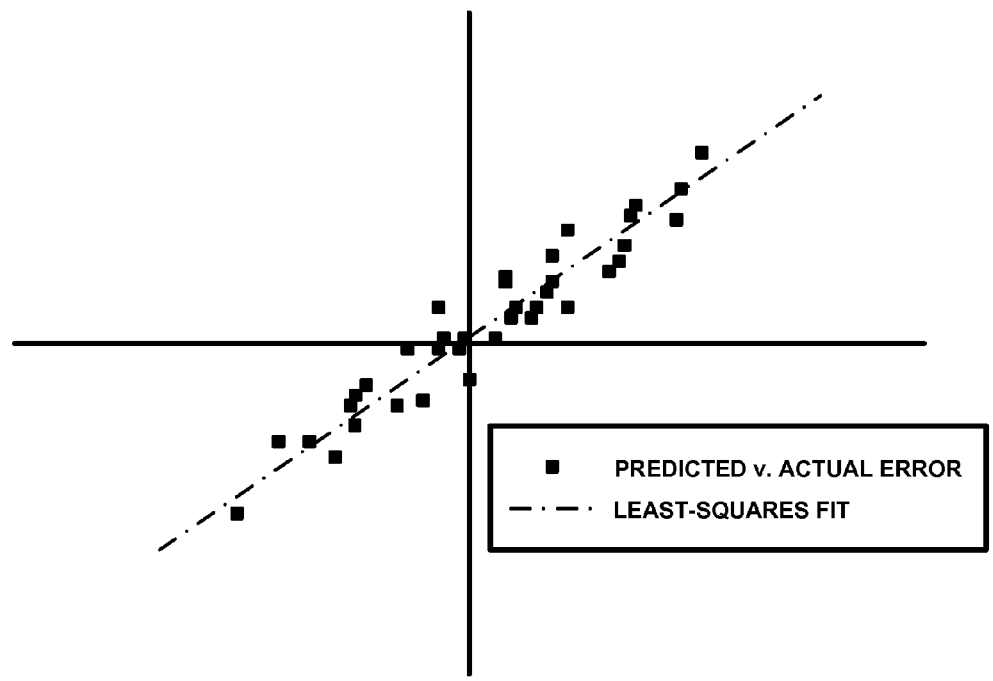
FIGS. 3A through 3C graphically depicts exemplary data associated with the preparation of a pre-established, predictive model for relating parametric data to predicted systematic error response according to an embodiment.
Figure 3B:
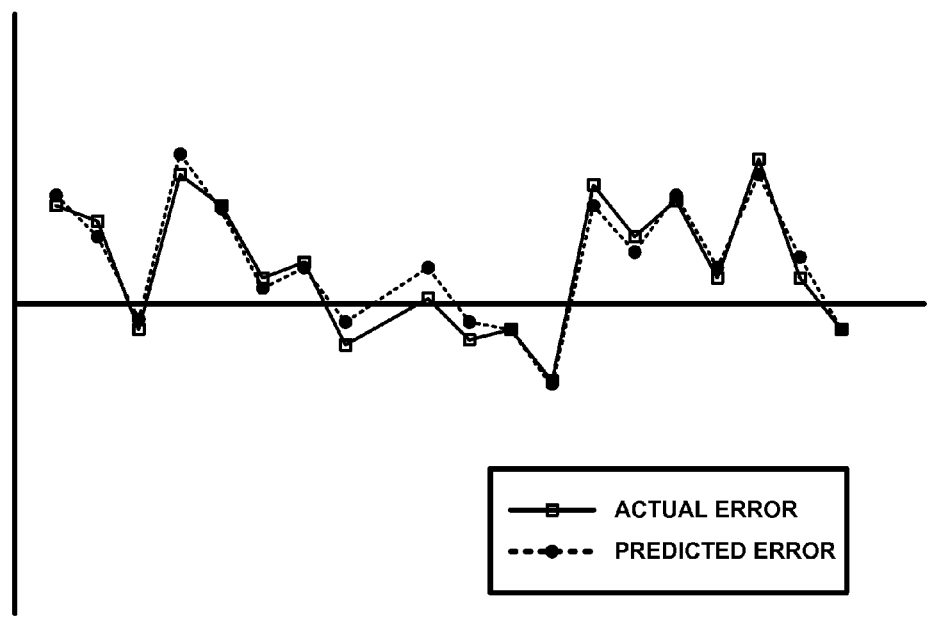
Figure 3C:
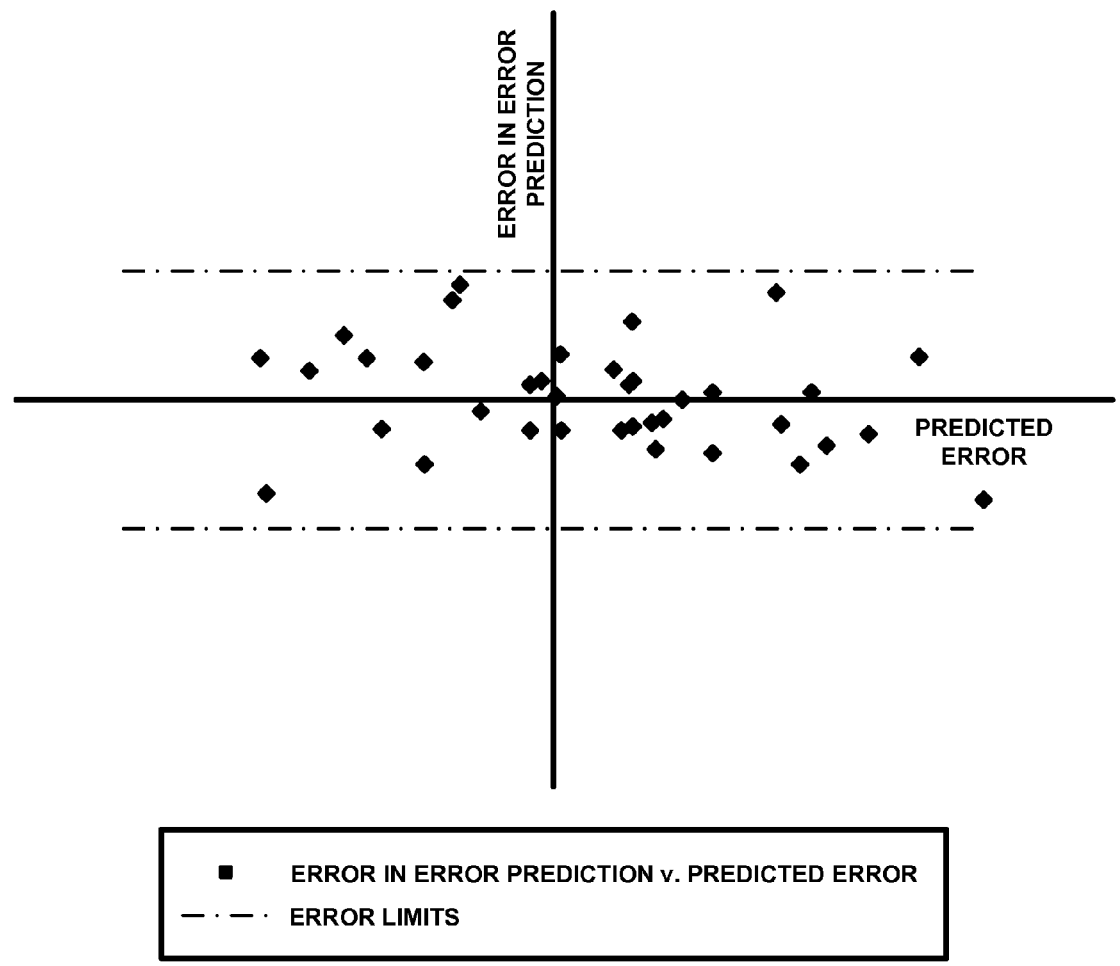
Figure 4:
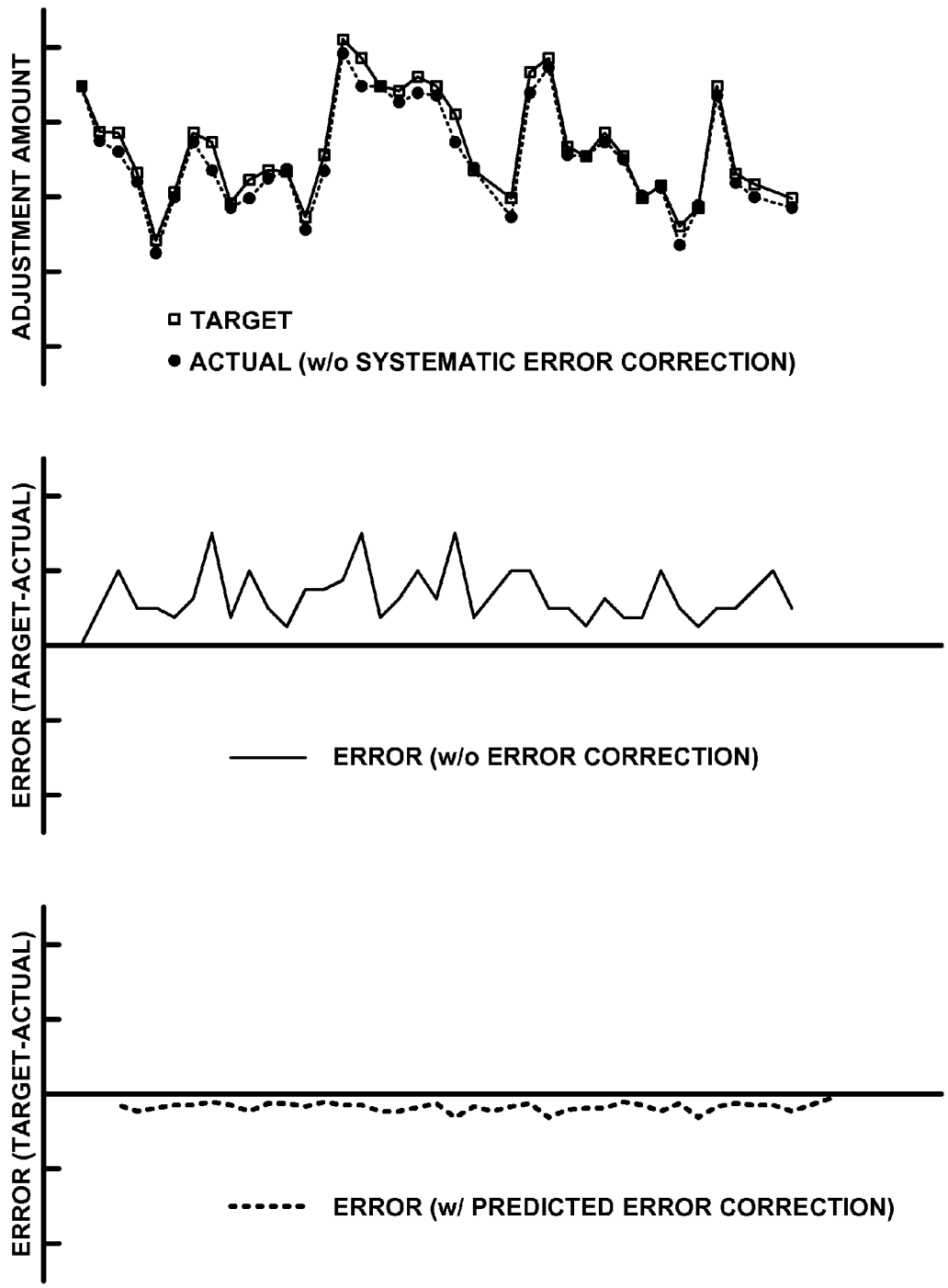
FIG. 4 graphically depicts exemplary data for correcting a GCIB process using a predicted systematic error response according to an embodiment.

As an example, FIGS. 3A through 3C graphically depict exemplary data associated with the preparation of a pre-established, predictive model for relating parametric data to predicted systematic error response. FIG. 3A plots the predicted systematic error, using the pre-established, predictive model, versus the actual systematic error, i.e., target minus actual profile. When the data is fit with a linear approximation, also in a least-squares sense, the slope is expected to be equal to unity. When using the second order error model (Equation (1), using first and second derivative data), the slope has been observed to exceed 0.9, and when the first order error model (Equation (2), using first derivative data), the slope has been observed to be approximately 0.9.

FIG. 3B graphically depicts the difference in the actual systematic error versus the predicted systematic error as a function of position on a representative workpiece. And, FIG. 3C plots the error in the error prediction, i.e., the difference between the actual and predicted error, versus the predicted systematic error. The inventors have found that the error in the error prediction can be plotted within limits set at about 25% the predicted or actual error.

In 12, a target profile of the measured attribute is identified to be achieved. The target profile may include an amount to remove (e.g., etch amount) or an amount to add (e.g., deposition, growth, or doping amount) to achieve the target profile starting with the initial profile.

In 13, a gas cluster ion beam (GCIB) is directed toward the upper layer of the workpiece. The GCIB may perform an etch process, a deposition process, a growth process, a smoothing process, a doping process, a modification process, or any combination of two or more thereof to achieve the target profile. The GCIB may be generated by maintaining a reduced-pressure environment around a workpiece holder for holding the workpiece in a GCIB processing system. The workpiece may include a microelectronic workpiece. The GCIB processing system may include any one of the GCIB processing systems (50, 100, 100' or 100") described below in FIG. 5, 6, 7, or 8, or any combination thereof.

In 14, an applied property of the GCIB, based at least in part on the predicted systematic error response and the parametric data, is spatially modulated as a function of position on the upper layer of the workpiece to achieve the target profile of the measured attribute. The applied property of the GCIB may include a beam dose. Alternatively, the applied property of the GCIB may include a beam dose, a beam area, a beam profile, a beam intensity, a beam scanning rate, or a dwell time, or any combination of two or more thereof.

Thereafter, the steps of collecting, determining, identifying, directing, or spatially modifying, or any combination of two or more thereof may be repeated to further reduce a difference between the target profile and an actual profile of the measured attribute. Furthermore, parametric data, collected from an upper layer of a workpiece that has been modified by a GCIB to achieve a target profile using a predictive error model, can be used to modify the existing (pre-established) predictive error model to adapt to variations in incoming workpieces. For example, parameters or coefficients of the predictive error model (i.e., the coefficients determined for Eqns. (1) or (2)) may require adjustment from workpiece-to-workpiece, or lot-to-lot, if there are substantive overall changes in the target profile, the difference between the actual and target profile, the uniformity of the actual profile or difference between actual and target profiles, etc. The adjustment of the parameters or coefficients may be weighted. For example, an updated parameter or coefficient may be the sum of an old value component and a new value component, e.g., $A_{UPDATED}=w*A_{NEW}+(1-w)*A_{OLD}$, wherein A is a coefficient being updated and w is a weighting factor.

Correction data is computed for location specific processing of the workpiece. More specifically, the correction data may be computed using the initial profile and the target profile for the measured attribute. The correction data for a given workpiece can comprise a process condition for modulation of a GCIB property, such as the GCIB dose, as a function of position on the workpiece in order to achieve a change between the parametric data associated with the incoming initial profile and the target profile for the given workpiece. For example, the correction data for a given workpiece can comprise determining a process condition for using the GCIB to correct a non-uniformity of the parametric data for the given workpiece. Alternatively, for example, the correction data for a given workpiece can comprise determining a process condition for using the GCIB to create a specifically intended non-uniformity of the parametric data for the given workpiece.

Using an established relationship between the desired change in parametric data and the GCIB dose and an established relationship between the GCIB dose and a GCIB process condition having a set of GCIB processing parameters, the controller determines correction data for each workpiece. For example, a mathematical algorithm can be employed to take the parametric data associated with the incoming initial profile, compute a difference between the incoming initial profile of parametric data and the target profile of parametric data, invert the GCIB processing pattern (i.e., etching pattern, film formation/deposition pattern, doping pattern, etc.) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. As will be described in greater detail below, the GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

The correction data may be combined with the predicted systematic error response to create a predicted systematic error-adjusted correction data. Thereafter, the predicted systematic error-adjusted correction data can be applied to the workpiece using a GCIB and spatially modulating, for example, the applied dose.

The correction data may be applied to the workpiece using a GCIB. During corrective processing, the GCIB may be configured to perform at least one of smoothing, amorphizing, modifying, doping, etching, growing, or depositing, or any combination of two or more thereof. The application of the corrective data to the workpiece may facilitate correction of workpiece defects, correction of workpiece surface planarity, correction of layer thickness, or improvement of layer adhesion. Once processed to GCIB specifications, the uniformity of the workpiece(s) or distribution of the parametric data for the workpiece(s) may be examined either in-situ or ex-situ, and the process may be finished or refined as appropriate.

When performing an etching process, for example, the GCIB can be formed from a pressurized gas mixture containing at least one etching gas. The at least one etching gas may include a halogen element. The at least one etching gas may include a halogen element and one or more elements selected from the group consisting of C, H, N, and S. The at least one etching gas may include a halogen element and one or more elements selected from the group consisting of Si and Ge.

For example, the at least one etching gas may include $F_2$, $Cl_2$, $Br_2$, $NF_3$, or $SF_6$. Additionally, for example, the at least one etching gas may include a halide, such as HF, HCl, HBr, or HI. Additionally yet, for example, the at least one etching gas may include a halosilane or halogermane, such as a mono-substituted halosilane or halogermane ($SiH_3F$, $GeH_3F$, etc.), di-substituted halosilane or halogermane ($SiH_2F_2$, $GeH_2F_2$, etc.), tri-substituted halosilane or halogermane ($SiHF_3$, $GeHF_3$, etc.), or tetra-substituted halosilane or halogermane ($SiF_4$, $GeF_4$, $SiCl_4$, $GeCl_4$, $SiBr_4$, or $GeBr_4$). Furthermore, for example, the at least one etching gas may include a halomethane, such as a mono-substituted halomethane (e.g., $CH_3F$, $CH_3Cl$, $CH_3Br$, $CH_3I$), a di-substituted halomethane (e.g., $CH_2F_2$, $CH_2ClF$, $CH_2BrF$, $CH_2FI$, $CH_2Cl_2$, $CH_2BrCl$, $CH_2ClI$, $CH_2Br_2$, $CH_2BrI$, $CH_2I_2$), a tri-substituted halomethane (e.g., $CHF_3$, $CHClF_2$, $CHBrF_2$, $CHF_2I$, $CHCl_2F$, $CHBrClF$, $CHClFI$, $CHBr_2F$, $CHBrFI$, $CHFI_2$, $CHCl_3$, $CHBrCl_2$, $CHCl_2I$, $CHBr_2Cl$, $CHBrClI$, $CHClI_2$, $CHBr_3$, $CHBr_2I$, $CHBrI_2$, $CHI_3$), or a tetra-substituted halomethane (e.g., $CF_4$, $CClF_3$, $CBrF_3$, $CF_3I$, $CCl_2F_2$, $CBrClF_2$, $CClF_2I$, $CBr_2F_2$, $CBrF_2I$, $CF_2I_2$, $CCl_3F$, $CBrCl_2F$, $CCl_2FI$, $CBr_2ClF$, $CBrClFI$, $CClFI_2$, $CBr_3F$, $CBr_2FI$, $CB rFI_2$, $CFI_3$, $CCl_4$, $CBrCl_3$, $CCl_3I$, $CBr_2Cl_2$, $CBrCl_2I$, $CCl_2I_2$, $CBr_3Cl$, $CBr_2ClI$, $CBrClI_2$, $CClI_3$, $CBr_4$, $CBr_3I$, $CBr_2I_2$, $CBrI_3$, $Cl_4$).

To form the GCIB, constituents of the etching gas should be selected that exist in a gaseous phase either alone or in combination with a carrier gas (e.g., a noble gas element or nitrogen) at relatively high pressure (e.g., a pressure of one atmosphere or greater).

In one embodiment, when etching a Si-containing and/or Ge-containing material, the at least one etching gas includes a halogen element selected from the group consisting of F, Cl, and Br. The at least one etching gas may further include Si, Ge, N, S, C, or H, or both C and H. For example, the at least one etching gas may include a halide, halosilane, halogermane, or a halomethane. Additionally, for example, the at least one etching gas may include $SiF_4$, $CHF_3$, $SF_6$, $NF_3$, $F_2$, $Cl_2$, $Br_2$, HF, HCl, HBr, $CClF_3$, $CBrF_3$, $CHClF_2$, or $C_2ClF_5$, or any combination of two or more thereof.

In another embodiment, when etching a Si-containing and/or Ge-containing material, the at least one etching gas includes two different halogen elements. A first halogen element may be selected from the group consisting of Cl and Br, and the second halogen element may include F. The at least one etching gas may further include C, or H, or both C and H. For example, the at least one etching gas may include a halomethane. Additionally, for example, the at least one etching gas may include $CClF_3$, $CBrF_3$, $CHClF_2$, or $C_2ClF_5$, or any combination of two or more thereof.

In another embodiment, when etching a Si-containing material having Si and one or more elements selected from the group consisting of O, C, N, and Ge, the at least one etching gas includes a halogen element and one or more elements selected from the group consisting of Si, Ge, N, S, C, and H. For example, the etching gas may include a halosilane or halomethane. Additionally, for example, the etching gas may include $SiF_4$, $CH_3F$, $CH_3Cl$, $CH_3Br$, $CHF_3$, $CHClF_2$, $CHBrF_2$, $CH_2F_2$, $CH_2ClF$, $CH_2BrF$, $CHCl_2F$, $CHBr_2F$, $CHCl_3$, $CHBrCl_2$, $CHBr_2Cl$, or $CHBr_3$, or any combination of two or more thereof.

In another embodiment, when etching a metal-containing material, the etching gas includes a halogen element selected from the group consisting of F, Cl, and Br. The etching gas may further include Si, Ge, N, S, C, or H, or both C and H. For example, the etching gas may include a halide, halosilane, halogermane, or a halomethane. Additionally, for example, the etching gas may include $SiF_4$, $CHF_3$, $SF_6$, $NF_3$, $F_2$, $Cl_2$, $Br_2$, HF, HCl, HBr, $CClF_3$, $CBrF_3$, $CHClF_2$, or $C_2ClF_5$, or any combination of two or more thereof.

In another embodiment, when etching a metal-containing material, the etching gas includes two different halogen elements. A first halogen element may be selected from the group consisting of Cl and Br, and the second halogen element may include F. The etching gas may further include C, or H, or both C and H. For example, the etching gas may include a halomethane. Additionally, for example, the etching gas may include $CClF_3$, $CBrF_3$, $CHClF_2$, or $C_2ClF_5$, or any combination of two or more thereof.

In yet another embodiment, when etching a chalcogenide material, the etching gas includes a halogen element. For example, the etching gas may include a halide, halosilane, halogermane, or halomethane. Additionally, for example, the etching gas may include $F_2$, $Cl_2$, $Br_2$, HF, HCl, HBr, $NF_3$, $SF_6$, $SiF_4$, $CH_3F$, $CH_3Cl$, $CH_3Br$, $CHF_3$, $CHClF_2$, $CHBrF_2$, $CH_2F_2$, $CH_2ClF$, $CH_2BrF$, $CHCl_2F$, $CHBr_2F$, $CHCl_3$, $CHBrCl_2$, $CHBr_2Cl$, or $CHBr_3$, or any combination of two or more thereof.

The at least one etching gas may include a first etching gas and a second etching gas. In one embodiment, the first etching gas contains Cl or Br, and the second etching gas contains F. For example, the first etching gas may contain $Cl_2$, and the second etching gas may contain $NF_3$. In another embodiment, the first etching gas contains a halomethane or halide, and the second etching gas contains F, Cl, or Br. In another embodiment, the first etching gas contains C, H, and a halogen element, and the second etching gas contains F, Cl, or Br. For example, the first etching gas may contain $CHF_3$, $CHCl_3$, or $CHBr_3$, and the second etching gas may contain $SiF_4$, $SF_6$, $NF_3$ or $Cl_2$. The first etching gas and the second etching gas may be continuously introduced to the GCIB. Alternatively, the first etching gas and the second etching gas may be alternatingly and sequentially introduced to the GCIB.

The pressurized gas mixture may further include a compound containing a halogen element; a compound containing F and C; a compound containing H and C; a compound containing C, H, and F; a compound containing Si and F; a compound containing Ge and F; or any combination of two or more thereof. Additionally, the pressurized gas mixture may further include a chlorine-containing compound, a fluorine-containing compound, or a bromine-containing compound. Additionally, the pressurized gas mixture may further include a compound containing one or more elements selected from the group consisting of S, N, Si, Ge, C, F, H, Cl, and Br. Additionally yet, the pressurized gas mixture may further include a silicon-containing compound, a germanium-containing compound, a nitrogen-containing compound, an oxygen-containing compound, or a carbon-containing compound, or any combination of two or more thereof. Furthermore, the pressurized gas mixture may further include one or more elements selected from the group consisting of B, C, H, Si, Ge, N, P, As, O, S, F, Cl, and Br. Further yet, the pressurized gas mixture may further include He, Ne, Ar, Kr, Xe, $O_2$, CO, $CO_2$, $N_2$, NO, $NO_2$, $N_2O$, $NH_3$, $F_2$, HF, $SF_6$, or $NF_3$, or any combination of two or more thereof.

Even further yet, the GCIB may be generated from a pressurized gas mixture that includes at least one dopant, or film forming constituent for depositing or growing a thin film, or any combination of two or more thereof. For example, the doping, modifying, etching, cleaning, growing, or depositing may comprise introducing one or more elements selected from the group consisting of He, Ne, Ar, Xe, Kr, B, C, Se, Te, Si, Ge, N, P, As, O, S, F, Cl, and Br.

In another embodiment, the GCIB may be generated by alternatingly and sequentially using a first pressurized gas mixture containing an etch gas and a second pressurized gas mixture containing a film forming gas. In yet other embodiments, a composition and/or a stagnation pressure of the GCIB may be adjusted during the etching.

As alluded to above, one or more GCIB properties of a GCIB process condition for the GCIB can be set to achieve the target profile. To achieve the target profile, the GCIB may be generated by performing the following: selecting a beam acceleration potential, one or more beam focus potentials, and a beam dose; accelerating the GCIB according to the beam acceleration potential; focusing the GCIB to according to the one or more beam focus potentials; and irradiating the accelerated GCIB onto at least a portion of the workpiece according to the beam dose.

Furthermore, in addition to these GCIB properties, a beam energy, a beam energy distribution, a beam angular distribution, a beam divergence angle, a stagnation pressure, a stagnation temperature, a mass flow rate, a cluster size, a cluster size distribution, a beam size, a beam composition, a beam electrode potential, or a gas nozzle design (such as nozzle throat diameter, nozzle length, and/or nozzle divergent section half-angle) may be selected. Any one or more of the aforementioned GCIB properties can be selected to achieve control of target etch process metrics, such as those noted above. Furthermore, any one or more of the aforementioned GCIB properties can be modified to achieve control of target etch process metrics, such as those noted above.

The beam energy distribution function for the GCIB may be modified by directing the respective GCIB along a GCIB path through an increased pressure region such that at least a portion of the GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to increase the beam divergence, or one may narrow the beam energy distribution to decrease the beam divergence.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm. As an example, the pressure-distance integral along the at least a portion of the GCIB path may range from 0.0001 torr-cm to 0.01 torr-cm. As another example, the pressure-distance integral along the at least a portion of the GCIB path may range from 0.001 torr-cm to 0.01 torr-cm.

Alternatively, the beam energy distribution function for the GCIB may be modified by modifying or altering a charge state of the respective GCIB. For example, the charge state may be modified by adjusting an electron flux, an electron energy, or an electron energy distribution for electrons utilized in electron collision-induced ionization of gas clusters.

In one embodiment, the one or more GCIB properties of the GCIB process condition may include a GCIB composition, a beam dose, a beam acceleration potential, a beam focus potential, a beam energy, a beam energy distribution, a beam angular distribution, a beam divergence angle, a flow rate of said GCIB composition, a stagnation pressure, a stagnation temperature, a background gas pressure for an increased pressure region through which said GCIB passes, or a background gas flow rate for an increased pressure region through which said GCIB passes (e.g., a P-Cell value, as will be discussed in greater detail below).

In another embodiment, the setting of the one or more GCIB properties to achieve the target profile may include setting a GCIB composition, a beam acceleration potential, a flow rate of the GCIB composition, and a background gas flow rate for an increased pressure region through which the GCIB passes.

For the GCIB, the beam acceleration potential may range up to 100 kV, the beam energy may range up to 100 keV, the cluster size may range up to several tens of thousands of atoms, and the beam dose may range up to about $1 \times 10^{17}$ clusters per cm$^2$. For example, the beam acceleration potential of the GCIB may range from about 1 kV to about 70 kV (i.e., the beam energy may range from about 1 keV to about 70 keV, assuming an average cluster charge state of unity). Additionally, for example, the beam dose of the GCIB may range from about $1 \times 10^{12}$ clusters per cm$^2$ to about $1 \times 10^{14}$ clusters per cm$^2$.

The GCIB may be established having an energy per atom ratio ranging from about 0.25 eV per atom to about 100 eV per atom. Alternatively, the GCIB may be established having an energy per atom ratio ranging from about 0.25 eV per atom to about 10 eV per atom. Alternatively, the GCIB may be established having an energy per atom ratio ranging from about 1 eV per atom to about 10 eV per atom.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the workpiece per unit area (i.e., number of clusters per unit area per unit time) may be held constant while the time is varied to change the beam dose.

The method described in FIG. 1 may further include altering the target profile to create one or more new target profiles, and setting one or more additional GCIB properties of an additional GCIB process condition for the GCIB to achieve the one or more new target etch process metrics.

Figure 5:
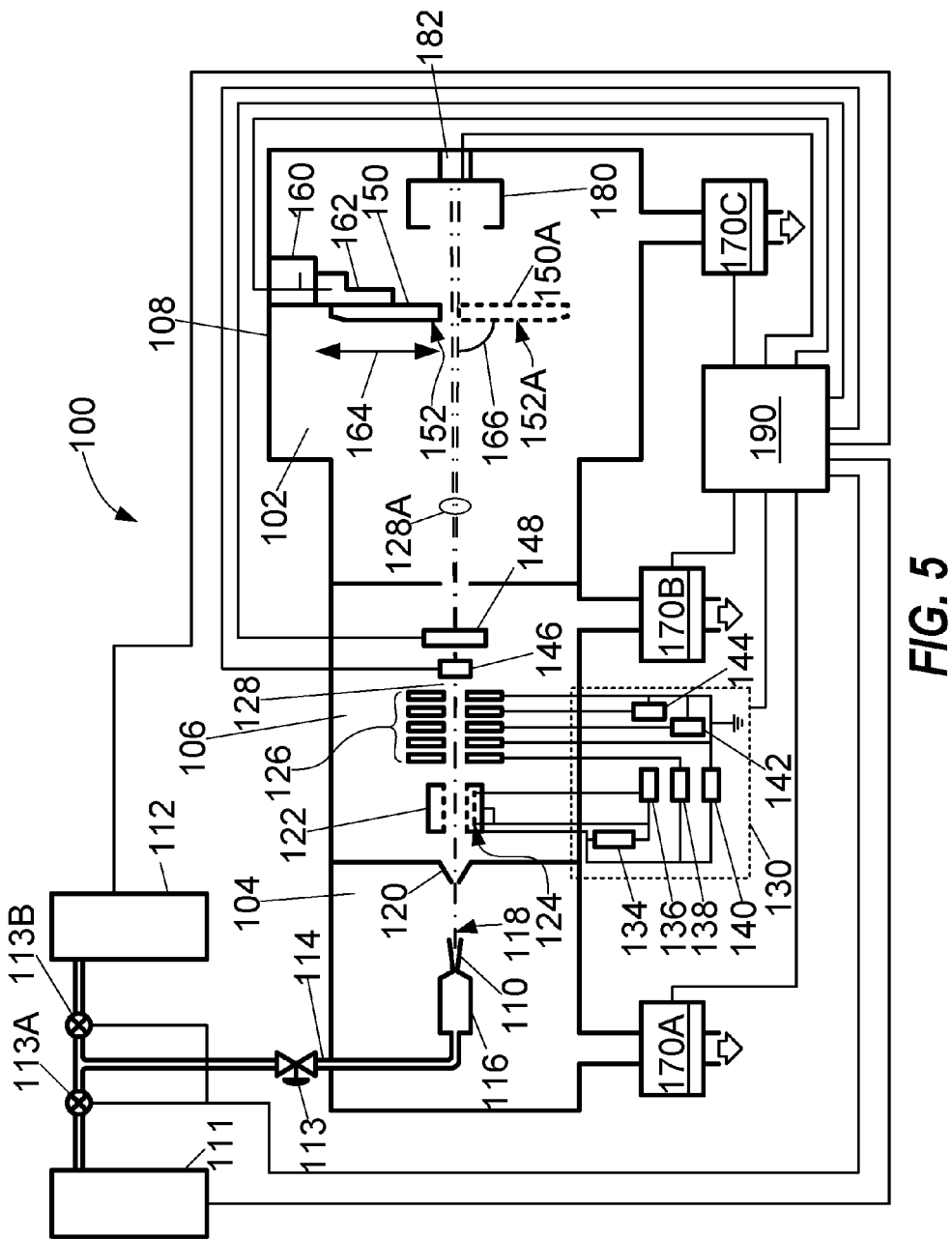
FIG. 5 is an illustration of a GCIB processing system.

Referring now to FIG. 5, a GCIB processing system 100 for treating a workpiece as described above is depicted according to an embodiment. The GCIB processing system 100 comprises a vacuum vessel 102, workpiece holder 150, upon which a workpiece 152 to be processed is affixed, and vacuum pumping systems 170A, 170B, and 170C. Workpiece 152 can be a semiconductor workpiece, a wafer, a flat panel display (FPD), a liquid crystal display (LCD), or any other workpiece. GCIB processing system 100 is configured to produce a GCIB for treating workpiece 152.

Referring still to GCIB processing system 100 in FIG. 5, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat workpiece 152.

As shown in FIG. 5, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to react with or be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The GCIB processing system 100 may also include multiple nozzles with one or more skimmer openings. Additional details concerning the design of a multiple gas cluster ion beam system are provided in U.S. Patent Application Publication No. 2010/0193701 A1, entitled "Multiple Nozzle Gas Cluster Ion Beam System" and filed on Apr. 23, 2009; and U.S. Patent Application Publication No. 2010/0193472A1, entitled "Multiple Nozzle Gas Cluster Ion Beam Processing System and Method of Operating" and filed on Mar. 26, 2010; the contents of which are herein incorporated by reference in their entirety.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 5, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 5, the beam electronics 130 include an extraction power supply 138 that provides voltage $V_{EE}$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 5, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A workpiece 152, which may be a wafer or semiconductor wafer, a flat panel display (FPD), a liquid crystal display (LCD), or other workpiece to be processed by GCIB processing, is disposed in the path of the process GCIB 128A in the processing chamber 108. Because most applications contemplate the processing of large workpieces with spatially uniform results, a scanning system may be desirable to uniformly scan the process GCIB 128A across large areas to produce spatially homogeneous results.

An X-scan actuator 160 provides linear motion of the workpiece holder 150 in the direction of X-scan motion (into and out of the plane of the paper). A Y-scan actuator 162 provides linear motion of the workpiece holder 150 in the direction of Y-scan motion 164, which is typically orthogonal to the X-scan motion. The combination of X-scanning and Y-scanning motions translates the workpiece 152, held by the workpiece holder 150, in a raster-like scanning motion through process GCIB 128A to cause a uniform (or otherwise programmed) irradiation of a surface of the workpiece 152 by the process GCIB 128A for processing of the workpiece 152.

The workpiece holder 150 disposes the workpiece 152 at an angle with respect to the axis of the process GCIB 128A so that the process GCIB 128A has an angle of beam incidence 166 with respect to a workpiece 152 surface. The angle of beam incidence 166 may be 90 degrees or some other angle, but is typically 90 degrees or near 90 degrees. During Y-scanning, the workpiece 152 and the workpiece holder 150 move from the shown position to the alternate position "A" indicated by the designators 152A and 150A, respectively. Notice that in moving between the two positions, the workpiece 152 is scanned through the process GCIB 128A, and in both extreme positions, is moved completely out of the path of the process GCIB 128A (over-scanned). Though not shown explicitly in FIG. 5, similar scanning and over-scan is performed in the (typically) orthogonal X-scan motion direction (in and out of the plane of the paper).

A beam current sensor 180 may be disposed beyond the workpiece holder 150 in the path of the process GCIB 128A so as to intercept a sample of the process GCIB 128A when the workpiece holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 5, control system 190 connects to the X-scan actuator 160 and the Y-scan actuator 162 through electrical cable and controls the X-scan actuator 160 and the Y-scan actuator 162 in order to place the workpiece 152 into or out of the process GCIB 128A and to scan the workpiece 152 uniformly relative to the process GCIB 128A to achieve desired processing of the workpiece 152 by the process GCIB 128A. Control system 190 receives the sampled beam current collected by the beam current sensor 180 by way of an electrical cable and, thereby, monitors the GCIB and controls the GCIB dose received by the workpiece 152 by removing the workpiece 152 from the process GCIB 128A when a predetermined dose has been delivered.

Figure 6:
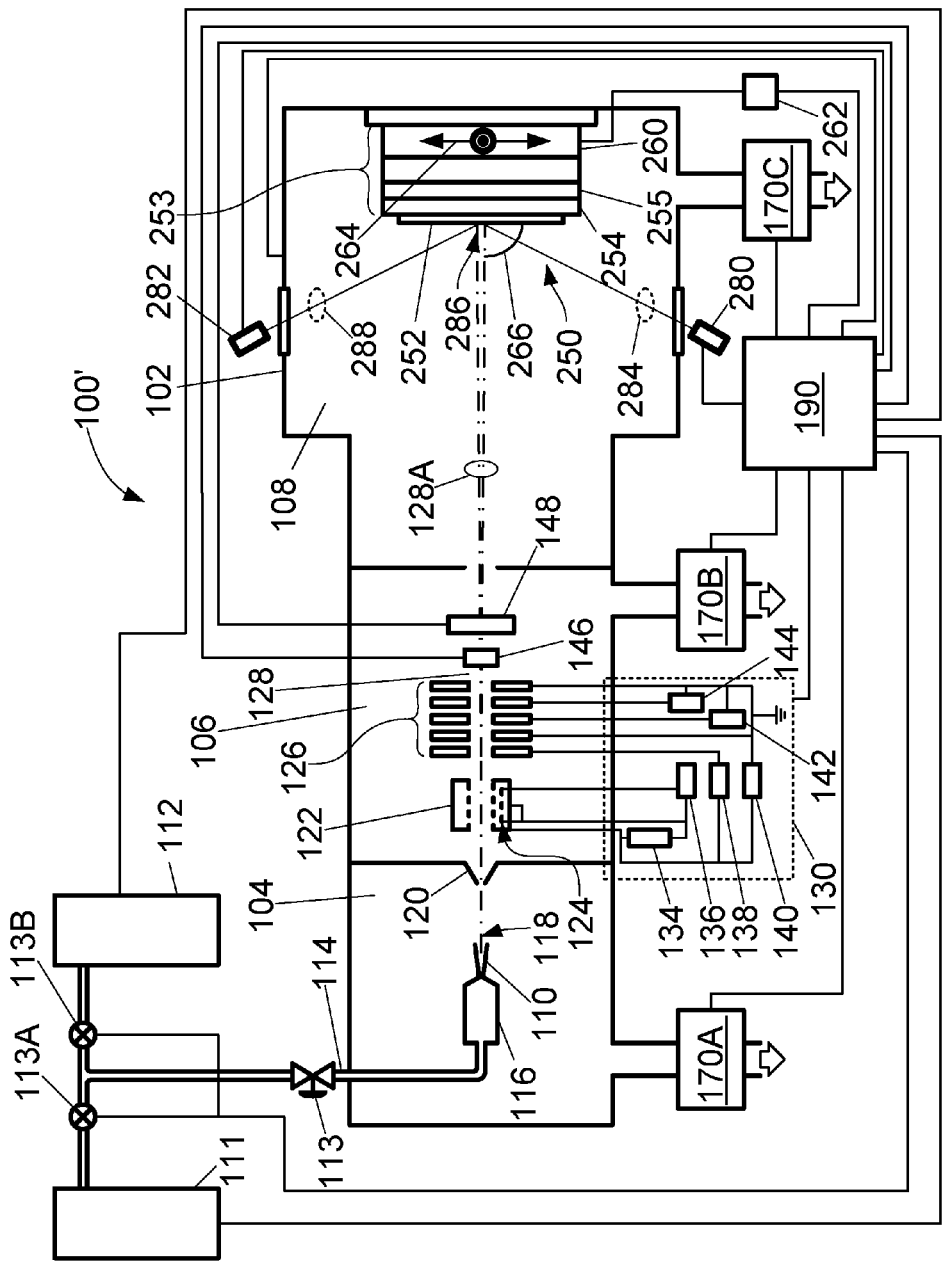
FIG. 6 is another illustration of a GCIB processing system.

In the embodiment shown in FIG. 6, the GCIB processing system 100' can be similar to the embodiment of FIG. 5 and further comprise a X-Y positioning table 253 operable to hold and move a workpiece 252 in two axes, effectively scanning the workpiece 252 relative to the process GCIB 128A. For example, the X-motion can include motion into and out of the plane of the paper, and the Y-motion can include motion along direction 264.

The process GCIB 128A impacts the workpiece 252 at a projected impact region 286 on a surface of the workpiece 252, and at an angle of beam incidence 266 with respect to the surface of workpiece 252. By X-Y motion, the X-Y positioning table 253 can position each portion of a surface of the workpiece 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the workpiece 252 within the projected impact region 286. In one embodiment, X-Y positioning table 253 is programmably operable by the control system 190 to scan, with programmable velocity, any portion of the workpiece 252 through the projected impact region 286 for GCIB processing by the process GCIB 128A.

The workpiece holding surface 254 of positioning table 253 is electrically conductive and is connected to a dosimetry processor operated by control system 190. An electrically insulating layer 255 of positioning table 253 isolates the workpiece 252 and workpiece holding surface 254 from the base portion 260 of the positioning table 253. Electrical charge induced in the workpiece 252 by the impinging process GCIB 128A is conducted through workpiece 252 and workpiece holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the workpiece 252 with the process GCIB 128A. The control system 190 monitors measurements of the GCIB current collected by the workpiece 252 in order to compute the accumulated dose received by the workpiece 252. When the dose received by the workpiece 252 reaches a predetermined dose, the control system 190 closes the beam gate 148 and processing of the workpiece 252 is complete. Based upon measurements of the GCIB dose received for a given area of the workpiece 252, the control system 190 can adjust the scan velocity in order to achieve an appropriate beam dwell time to treat different regions of the workpiece 252.

Alternatively, the process GCIB 128A may be scanned at a constant velocity in a fixed pattern across the surface of the workpiece 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate workpiece 252 with an incident optical signal 284 and to receive a scattered optical signal 288 from workpiece 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a workpiece, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the workpiece 252.

Figure 7:
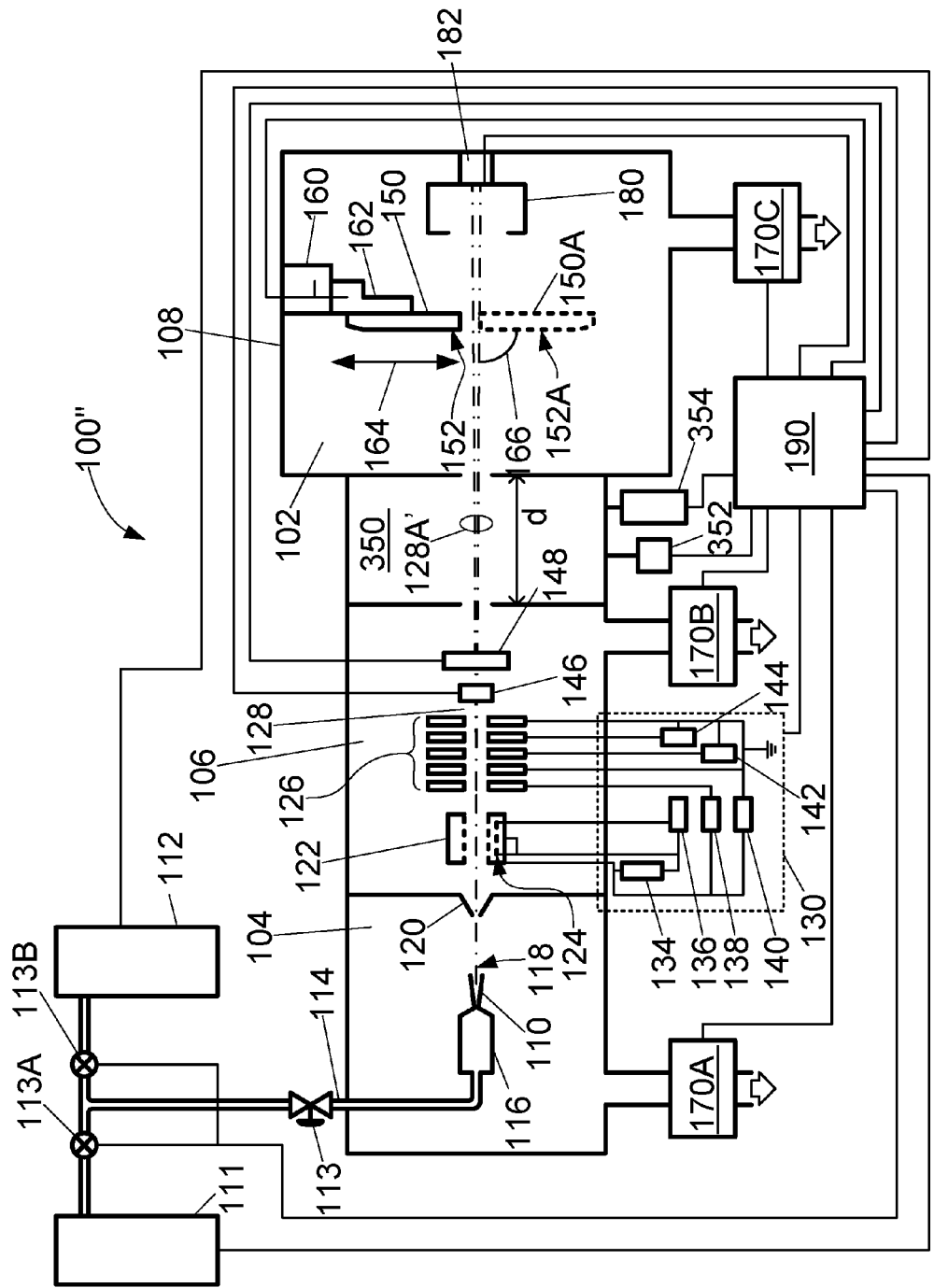
FIG. 7 is yet another illustration of a GCIB processing system.

In the embodiment shown in FIG. 7, the GCIB processing system 100" can be similar to the embodiment of FIG. 5 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on workpiece 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Workpiece 152 (or 252) can be affixed to the workpiece holder 150 (or workpiece holder 250) via a clamping system (not shown), such as a mechanical clamping system or an electrical clamping system (e.g., an electrostatic clamping system). Furthermore, workpiece holder 150 (or 250) can include a heating system (not shown) or a cooling system (not shown) that is configured to adjust and/or control the temperature of workpiece holder 150 (or 250) and workpiece 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 8:
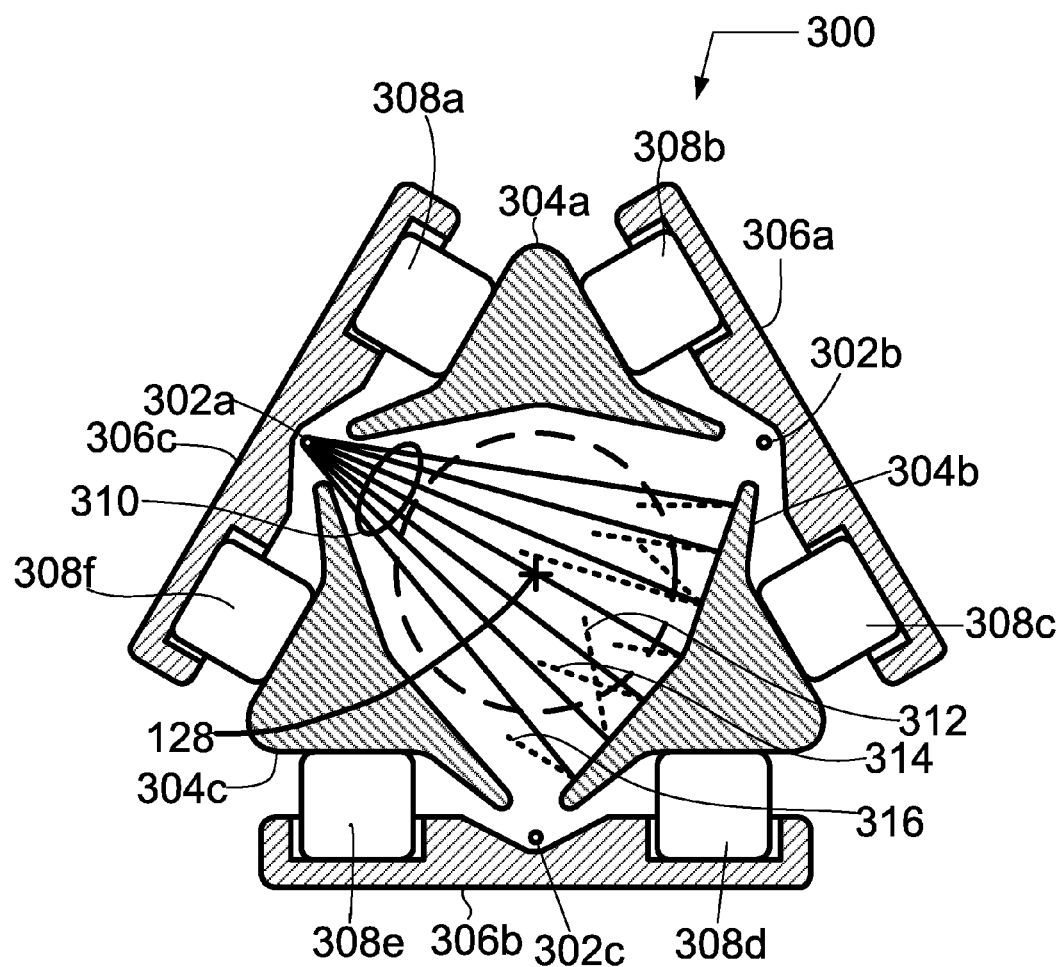
FIG. 8 is an illustration of an ionization source for a GCIB processing system.

Referring now to FIG. 8, a section 300 of an ionizer (122, FIGS. 5, 6 and 7) for ionizing a gas cluster jet (gas cluster beam 118, FIGS. 5, 6 and 7) is shown. The section 300 is normal to the axis of GCIB 128. For typical gas cluster sizes (2000 to 15000 atoms), clusters leaving the gas skimmer (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 8 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Figure 9:
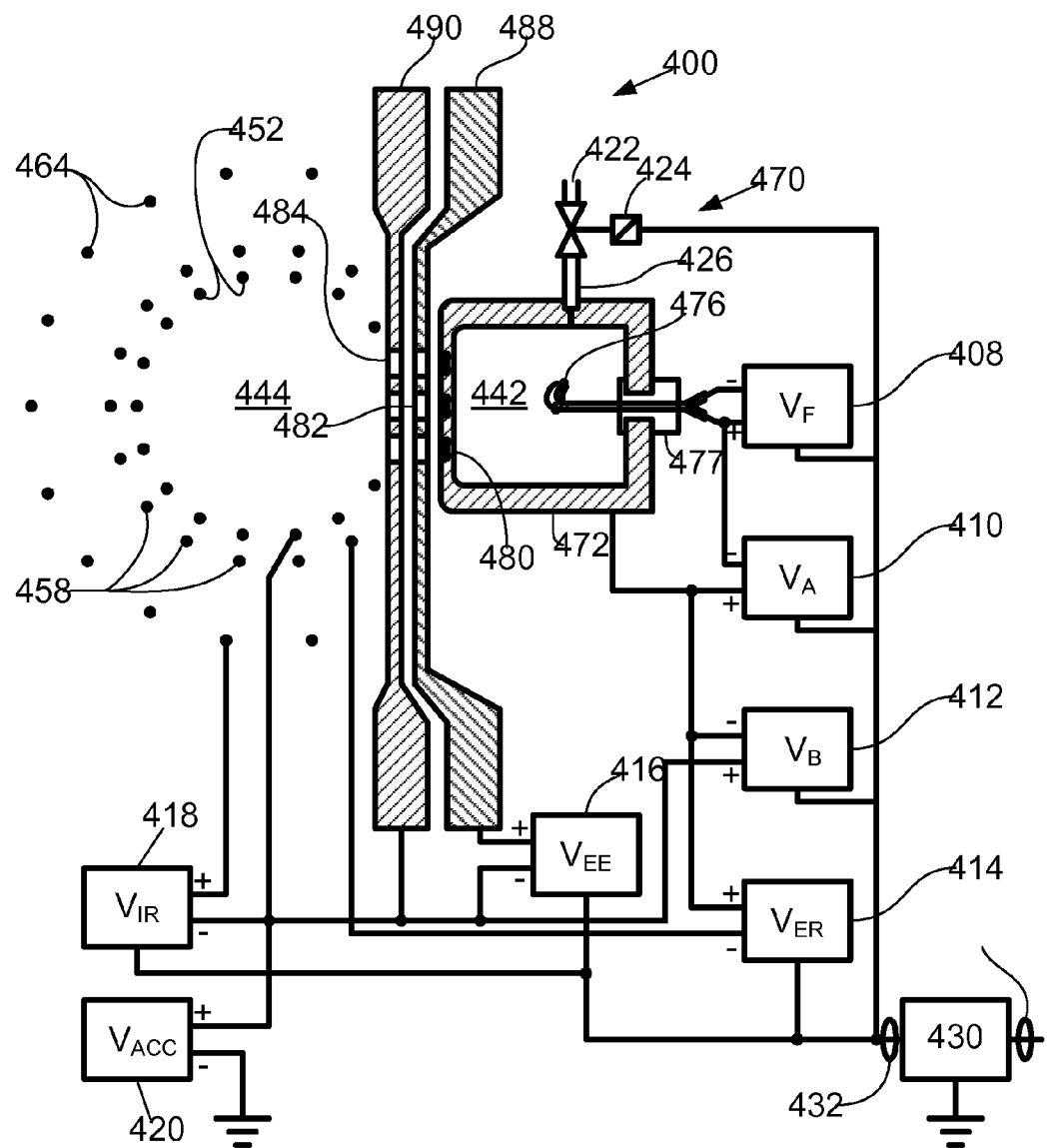
FIG. 9 is an illustration of another ionization source for a GCIB processing system.

Alternatively, ionizers may use electron extraction from plasma to ionize clusters. The geometry of these ionizers is quite different from the three filament ionizer described above but the principles of operation and the ionizer control are very similar. Referring now to FIG. 9, a section 400 of an ionizer (122, FIGS. 5, 6 and 7) for ionizing a gas cluster jet (gas cluster beam 118, FIGS. 5, 6 and 7) is shown. The section 400 is normal to the axis of GCIB 128. For typical gas cluster sizes (2000 to 15000 atoms), clusters leaving the gas skimmer (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 9 illustrates a self-neutralizing ionizer. As with other ionizers, gas clusters are ionized by electron impact.

The ionizer includes an array of thin rod anode electrodes 452 that is supported and electrically connected by a support plate (not shown). The array of thin rod anode electrodes 452 is substantially concentric with the axis of the gas cluster beam (e.g., gas cluster beam 118, FIGS. 5, 6 and 7). The ionizer also includes an array of thin rod electron-repeller rods 458 that is supported and electrically connected by another support plate (not shown). The array of thin rod electron-repeller electrodes 458 is substantially concentric with the axis of the gas cluster beam (e.g., gas cluster beam 118, FIGS. 5, 6 and 7). The ionizer further includes an array of thin rod ion-repeller rods 464 that is supported and electrically connected by yet another support plate (not shown). The array of thin rod ion-repeller electrodes 464 is substantially concentric with the axis of the gas cluster beam (e.g., gas cluster beam 118, FIGS. 5, 6 and 7).

Energetic electrons are supplied to a beam region 444 from a plasma electron source 470. The plasma electron source 470 comprises a plasma chamber 472 within which plasma is formed in plasma region 442. The plasma electron source 470 further comprises a thermionic filament 476, a gas entry aperture 426, and a plurality of extraction apertures 480. The thermionic filament 476 is insulated from the plasma chamber 470 via insulator 477. As an example, the thermionic filament 476 may include a tungsten filament having one-and-a-half turns in a "pigtail" configuration.

The section 400 of the gas cluster ionizer comprises an electron-acceleration electrode 488 having plural apertures 482. Additionally, the section 400 comprises an electron-deceleration electrode 490 having plural apertures 484. The plural apertures 482, the plural apertures 484, and the plural extraction apertures 480 are all aligned from the plasma region 442 to the beam region 444.

Plasma forming gas, such as a noble gas, is admitted to the plasma chamber 472 through gas entry aperture 426. An insulate gas feed line 422 provides pressurized plasma forming gas to a remotely controllable gas valve 424 that regulates the admission of plasma forming gas to the plasma chamber 472.

A filament power supply 408 provides filament voltage ($V_F$) for driving current through thermionic filament 476 to stimulate thermo-electron emission. Filament power supply 408 controllably provides about 140 to 200 A (amps) at 3 to 5 V (volts). An arc power supply 410 controllably provides an arc voltage ($V_A$) to bias the plasma chamber 472 positive with respect to the thermionic filament 476. Arc power supply 410 is typically operated at a fixed voltage, typically about 35 V, and provides means for accelerating the electrons within the plasma chamber 472 for forming plasma. The filament current is controlled to regulate the arc current supplied by the arc power supply 410. Arc power supply 410 is capable of providing up to 5 A arc current to the plasma arc.

Electron deceleration electrode 490 is biased positively with respect to the plasma chamber 472 by electron bias power supply 412. Electron bias power supply 412 provides bias voltage ($V_B$) that is controllably adjustable over the range of from 30 to 400 V. Electron acceleration electrode 488 is biased positively with respect to electron deceleration electrode 490 by electron extraction power supply 416. Electron extraction power supply 416 provides electron extraction voltage ($V_{EE}$) that is controllable in the range from 20 to 250 V. An acceleration power supply 420 supplies acceleration voltage ($V_{ACC}$) to bias the array of thin rod anode electrodes 452 and electron deceleration electrode 490 positive with respect to earth ground. $V_{ACC}$ is the acceleration potential for gas cluster ions produced by the gas cluster ionizer shown in section 400 and is controllable and adjustable in the range from 1 to 100 kV. An electron repeller power supply 414 provides electron repeller bias voltage ($V_{ER}$) for biasing the array of thin rod electron-repeller electrodes 458 negative with respect to $V_{ACC}$. $V_{ER}$ is controllable in the range of from 50 to 100 V. An ion repeller power supply 418 provides ion repeller bias voltage ($V_{IR}$) to bias the array of thin rod ion-repeller electrodes 464 positive with respect to $V_{ACC}$. $V_{IR}$ is controllable in the range of from 50 to 150 V.

A fiber optics controller 430 receives electrical control signals on cable 434 and converts them to optical signals on control link 432 to control components operating at high potentials using signals from a grounded control system. The fiber optics control link 432 conveys control signals to remotely controllable gas valve 424, filament power supply 408, arc power supply 410, electron bias power supply 412, electron repeller power supply 414, electron extraction power supply 416, and ion repeller power supply 418.

For example, the ionizer design may be similar to the ionizer described in U.S. Pat. No. 7,173,252, entitled "Ionizer and method for gas-cluster ion-beam formation"; the content of which is incorporated herein by reference in its entirety.

The ionizer (122, FIGS. 5, 6 and 7) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of modifying an upper layer of a workpiece using a gas cluster ion beam (GCIB), the method comprising:
    collecting parametric data relating to an upper layer of a workpiece, said parametric data including an initial profile of a measured attribute of said upper layer and at least one $n^{th}$ order derivative of a spatial variation of said measured attribute, wherein n is an integer greater than zero;
    determining a predicted systematic error response for applying a GCIB to said upper layer to alter said initial profile of said measured attribute by using said parametric data, including said at least one $n^{th}$ order derivative, as input to a pre-established, predictive model;
    identifying a target profile of said measured attribute;
    directing a gas cluster ion beam (GCIB) toward said upper layer of said workpiece; and
    spatially modulating an applied property of said GCIB, based at least in part on said predicted systematic error response and said parametric data, as a function of position on said upper layer of said workpiece to achieve said target profile of said measured attribute.

2. The method of claim 1, wherein said measured attribute comprises a film thickness, a surface roughness, a surface contamination, a feature depth, a trench depth, a via depth, a feature width, a trench width, a via width, a critical dimension (CD), a surface roughness, or an electrical resistance, or any combination of two or more thereof.

3. The method of claim 1, wherein said at least one $n^{th}$ order derivative of a spatial variation of said measured attribute includes a first derivative of a spatial variation of said measured attribute on said workpiece.

4. The method of claim 3, wherein said at least one $n^{th}$ order derivative of a spatial variation of said measured attribute further includes a second derivative of a spatial variation of said measured attribute on said workpiece.

5. The method of claim 1, wherein said at least one $n^{th}$ order derivative of a spatial variation of said measured attribute is computed at each location said measured attribute of said upper layer is acquired using an interpolation algorithm, or a data fitting algorithm, or a combination thereof.

6. The method of claim 1, further comprising:
    computing correction data using said initial profile and said target profile for said measured attribute;
    combining said correction data with said predicted systematic error response to create a predicted systematic error-adjusted correction data; and
    applying said predicted systematic error-adjusted correction data to said workpiece by spatially modulating said applied dose.

7. The method of claim 1, further comprising:
    establishing said pre-established, predictive model by performing the following:
        measuring representative parametric data including an initial representative profile of a representative attribute of an upper layer and at least one $n^{th}$ order derivative of a spatial variation of said representative attribute, wherein n is an integer greater than zero;
        establishing a representative target profile;
        computing representative correction data using said initial representative profile and said target representative profile for said representative attribute;
        applying said representative correction data to said workpiece by spatially modulating an applied dose of a representative GCIB;
        comparing an actual representative profile with said target representative profile to determine a representative systematic error; and
        correlating said representative systematic error with said representative parametric data.

8. The method of claim 7, wherein said correlating includes applying a least-squares technique to said representative parametric data and said representative systematic error and formulating a functional relationship between said representative parametric data and said representative systematic error that minimizes a sum of the squared residuals produced by said functional relationship.

9. The method of claim 1, wherein said applied property of said GCIB includes a beam dose.

10. The method of claim 1, wherein said applied property of said GCIB includes a beam dose, a beam area, a beam profile, a beam intensity, a beam scanning rate, or a dwell time, or any combination of two or more thereof.

11. The method of claim 1, wherein said GCIB performs an etch process, a deposition process, a growth process, a smoothing process, a doping process, a modification process, or any combination of two or more thereof to achieve said target profile.

12. The method of claim 1, further comprising:
    repeating the steps of collecting, determining, identifying, directing, or spatially modifying, or any combination of two or more thereof to further reduce a difference between said target profile and an actual profile of said measured attribute.

13. The method of claim 1, wherein said workpiece comprises a microelectronic workpiece.

14. A processing system configured to perform location specific processing on a workpiece, comprising:
    a GCIB processing system configured to treat a workpiece with a GCIB; and
    a multi-process controller configured to:
        receive parametric data relating to an upper layer of a workpiece, said parametric data including an initial profile of a measured attribute of said upper layer and at least one $n^{th}$ order derivative of a spatial variation of said measured attribute, wherein n is an integer greater than zero;

determine a predicted systematic error response for applying said GCIB to said upper layer to alter said initial profile of said measured attribute by using said parametric data, including said at least one $n^{th}$ order derivative, as input to a pre-established, predictive model;

identify a target profile of said measured attribute;

direct said GCIB toward said upper layer of said workpiece; and spatially modulate an applied property of said GCIB, based at least in part on said predicted systematic error response and said parametric data, of said GCIB as a function of position on said upper layer of said workpiece to achieve said target profile of said measured attribute.

15. The system of claim 14, further comprising:

a metrology system configured to collect said parametric data for one or more workpieces.

16. The method of claim 15, wherein said metrology system comprises optical digital profilometry (ODP), scatterometry, ellipsometry, reflectometry, interferometry, X-ray fluorescence spectroscopy, scanning electron microscopy (SEM), tunneling electron microscopy (TEM), atomic force microscopy (AFM), or four-point probe sensing, or any combination of two or more thereof.

17. The system of claim 14, wherein said GCIB processing system comprises a vacuum enclosure, a gas or vapor source configured to produce a GCIB inside said vacuum enclosure, and a workpiece holder configured to support said given workpiece in said vacuum enclosure.

18. The system of claim 17, wherein said gas or vapor source supplies an inert material or a reactive material relative to the materials exposed on said workpiece.

19. The system of claim 17, wherein said gas or vapor source supplies one or more elements selected from the group consisting of B, C, H, Si, Ge, N, P, As, O, S, F, Cl, and Br.

20. The system of claim 17, further comprising:

a scanner arranged within said vacuum enclosure to scan said workpiece holder through said GCIB.

* * * * *